United States Patent [19]
Lehikoinen

[11] Patent Number: 5,642,063
[45] Date of Patent: Jun. 24, 1997

[54] CURRENT-SAVING DETECTION FOR INPUT SIGNAL LEVEL EXCEEDING A THRESHOLD VALUE

[75] Inventor: Markku Lehikoinen, Oulu, Finland

[73] Assignee: Nokia Mobile Phones Ltd., Salo, Finland

[21] Appl. No.: 535,487

[22] Filed: Sep. 28, 1995

[30] Foreign Application Priority Data

Oct. 3, 1994 [FI] Finland .................. 944609

[51] Int. Cl.$^6$ .................. H03K 5/153; G05F 1/10
[52] U.S. Cl. .................. 327/74; 327/544
[58] Field of Search .................. 327/63, 69, 70, 327/72, 74–81, 560–563, 142, 143, 198, 544, 530

[56] References Cited

U.S. PATENT DOCUMENTS

| | | | |
|---|---|---|---|
| 3,688,128 | 8/1972 | Van Essen et al. | 327/75 |
| 5,220,220 | 6/1993 | Tse et al. | 327/78 |
| 5,291,075 | 3/1994 | Hollstein et al. | 327/78 |
| 5,291,542 | 3/1994 | Kivari et al. | 379/58 |
| 5,378,935 | 1/1995 | Korhonen et al. | 327/114 |
| 5,416,435 | 5/1995 | Jokinen et al. | 327/113 |
| 5,488,322 | 1/1996 | Kaplinsky | 327/74 |
| 5,508,649 | 4/1996 | Shay | 327/78 |

FOREIGN PATENT DOCUMENTS

| | | |
|---|---|---|
| 2093834 | 10/1993 | Canada . |
| 0368398 A1 | 5/1990 | European Pat. Off. . |
| 1927185 | 12/1969 | Germany . |
| 1537185 | 8/1973 | Germany . |
| 2513481 A1 | 10/1975 | Germany . |
| 3837821 A1 | 5/1990 | Germany . |

*Primary Examiner*—Toan Tran
*Attorney, Agent, or Firm*—Perman & Green, LLP

[57] ABSTRACT

The invention relates to a method and a comparison circuit for the detection of an input signal level exceeding a threshold value in an accurate and current-saving manner. The comparison is done in two phases: the circuit has a transistor switch (4) for the coarse comparison and a comparator (1) for the accurate comparison. The output (PWD) of the switch (4) switches the comparator (1) and the accurate reference voltage (VREF2) generator on when the input voltage (VIN) exceeds the threshold level (VREF1) of the switch (4). The comparator (1) switches the output voltage (VOUT) on when the input voltage (VIN) exceeds the accurate reference voltage (VREF2). The inventive comparison circuit is used e.g. in mobile telephones.

15 Claims, 2 Drawing Sheets

5,642,063

CURRENT-SAVING DETECTION FOR INPUT SIGNAL LEVEL EXCEEDING A THRESHOLD VALUE

FIELD OF THE INVENTION

The invention relates to a method and a comparison circuit for the detection of an input signal level exceeding a threshold value with a current-saving circuit.

BACKGROUND OF THE INVENTION

The limited capacity of power sources, ie. batteries, and their relatively short operating time between charging periods is a known problem with mobile telephones. In an attempt to make the operating time, ie. the time between chargings, of a mobile telephone longer, all circuits of the telephone are switched off when they are not used. However, some parts of the telephone's power supply circuitry are continuously connected to the battery and, therefore, in present devices, there is a continuous discharge current of about 400 to 500 μA from the battery. In addition, there is the self-discharge current of about 100 μA discharging from the battery. When a battery pack with the capacity of, say, 400 mAh is attached to the telephone, it will discharge in about 28 days even if the telephone is not used (400 mAh/(500 g A+100 μA)=667 h=28 days).

One of the parts in the power supply circuitry is a voltage comparator which has to be capable of accurate detection of the input voltage, ie. voltage comparison. Then the voltage of the analog input pin has to be detected very accurately to start a certain integrated circuit and then also the threshold value of the input signal detector has to be very accurate. The device should not function without this certain voltage in the pin and, on the other hand, the device should be turned on immediately after this certain voltage becomes available.

Appropriate prior art comparison circuits will be studied with the help of an example, with reference to the enclosed FIGS. 1 and 2, of which FIG. 1 shows an accurate detection method, or a comparison circuit, for an input signal and Figure its signals as a function of the input signal voltage level. FIG. 1 shows a comparator 1 which compares the input signal VIN to an accurate reference voltage VREF. The comparator 1 switches the output voltage VOUT on when the input voltage VIN exceeds the reference voltage VREF. FIG. 2 shows signals of the accurate detection of input signal as a function of the input signal voltage level. In the drawing, the input voltage VIN is represented by curve 2 and the output voltage VOUT by curve 3. The comparator 1 switches the output voltage VOUT on when the input voltage VIN exceeds the reference voltage VREF.

When a mobile telephone uses for voltage detection a method like the one described above, the discharge current of the battery is far too big for a lithium battery. It would be interesting to use a lithium battery but, depending on the case, a lithium battery can be continuously discharged with a current of 10 to 100 μA, at the most. In prior art solutions, the use of lithium batteries is not possible without a hardware switch or a similar circuitry.

SUMMARY OF THE INVENTION

It is an object of the invention to decrease the discharge current explained above and, to that end, we will now further study the comparator circuit mentioned above.

In accordance with the objective, it is characteristic of the inventive method that the input signal is first taken to a first comparing element that generates an intermediate output signal in its output only when the input signal level exceeds the coarse reference voltage; the intermediate output signal switches on a second comparing element; and the input signal is also taken to the second comparing element which generates a detection signal in its output only when the input signal level exceeds the accurate reference voltage. Then it is assumed that the absolute value of the accurate reference voltage is bigger than the absolute value of the coarse reference voltage. Advantageously, the intermediate output signal also switches on the accurate reference voltage generator.

A comparison circuit that implements the method according to the invention is advantageously so implemented that the first comparing element is a transistor switch, in which case the coarse reference voltage is the threshold voltage of the transistor. The transistor switch may be an NPN transistor with a threshold voltage of about 0.7 V; then the electric circuit of the transistor is so dimensioned that the current it takes from the power source is small, advantageously about 100 μA, when the input voltage is smaller than the coarse reference voltage.

It is an advantage of the inventive solution that a lithium battery can be used as a power source for the device.

BRIEF DESCRIPTION OF THE DRAWINGS

Other characteristics and advantages of the invention are illustrated by the following implementation example which is explained in detail with reference to the enclosed drawings, where.

DETAILED DESCRIPTION OF THE INVENTION

In the inventive method, an input signal exceeding the input signal level threshold value is detected by means of a comparing element and a reference voltage brought to it. The method can be implemented in phases; hence, referring to FIGS. 3 and 4:

a) an input signal VIN (5) is brought to a first comparing element, or, a transistor 4 (POWER DOWN) which generates an intermediate output signal PWD (6) in its output only when the level of the input signal VIN (5) exceeds the coarse reference voltage VREF1;

b) the intermediate output signal PWD (6) switches a second comparing element 1 (COMPARATOR) and the accurate reference voltage VREF2 generator (9, in FIG. 5) on; and c) the input signal VIN (5) is brought to the second comparing element 1 which generates in its output a detection signal VOUT (7) only when the level of the input signal VIN (5) exceeds the accurate reference voltage VREF2.

The absolute value of the accurate reference voltage VREF2 is higher than the absolute value of the coarse reference voltage VREF1, which means, as one skilled in the art will understand, that the voltage logic can be positive or negative. In the following examples a positive voltage logic will be assumed, ie. the voltages are positive in comparison with the ground, or zero, of the comparison circuit.

Figure 1:
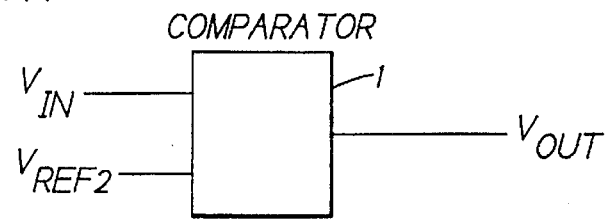
FIGS. 1 and 2 illustrate prior an methods described above.
Figure 2:
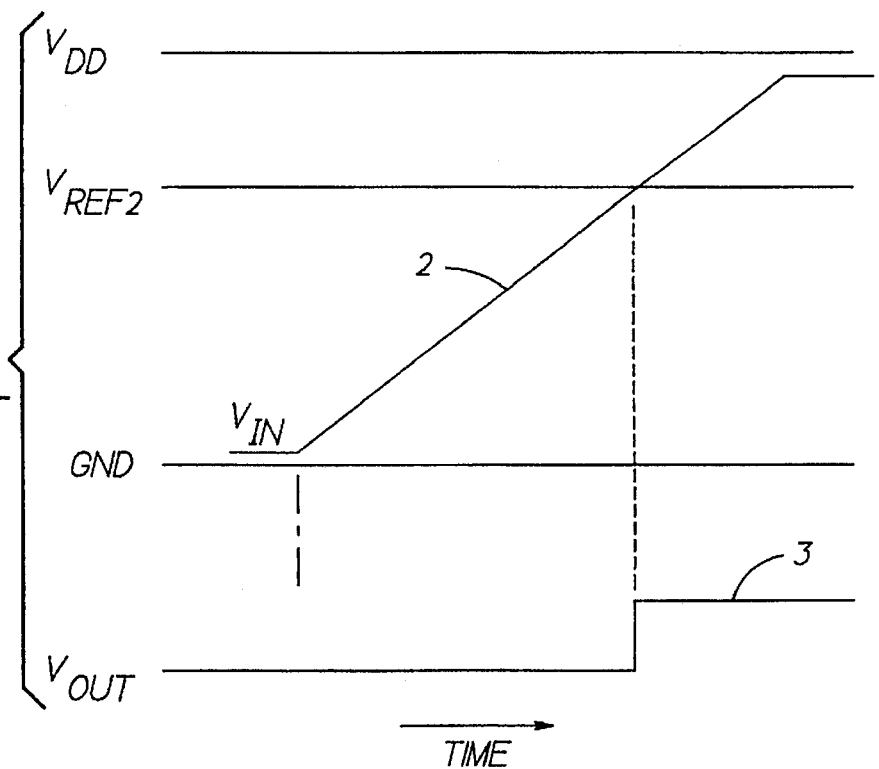
Figure 3:
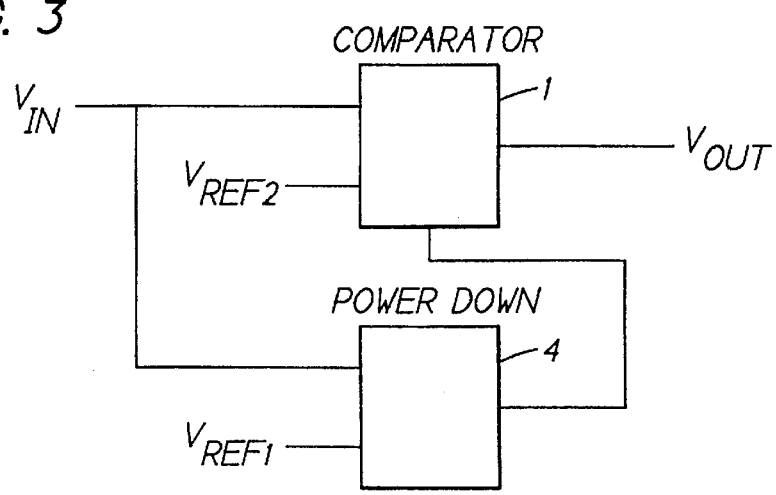
FIG. 3 shows a block diagram of the accurate detector solution for the input signal according to the invention.

FIG. 3 is a simplified block diagram of the inventive accurate detection method for an input signal. The method includes a comparator 1 and a switch 4. When the device is inactive the comparator 1 is off and, thus, is not taking any current from the battery. The input voltage is coarsely detected by means of the switch 4. When the input voltage VIN in the coarse detection exceeds the reference level VREF 1 of the switch 4, the output (PWD) of the switch 4 switches the comparator I on, enabling accurate detection. The comparator I compares the input signal VIN to the accurate reference voltage VREF2. The comparator 1 switches the output voltage VOUT. ie. the detection result, on when the input voltage VIN exceeds the reference voltage VREF2. The switch 4 is so implemented that it consumes significantly less power than the comparator 1.

Figure 4:
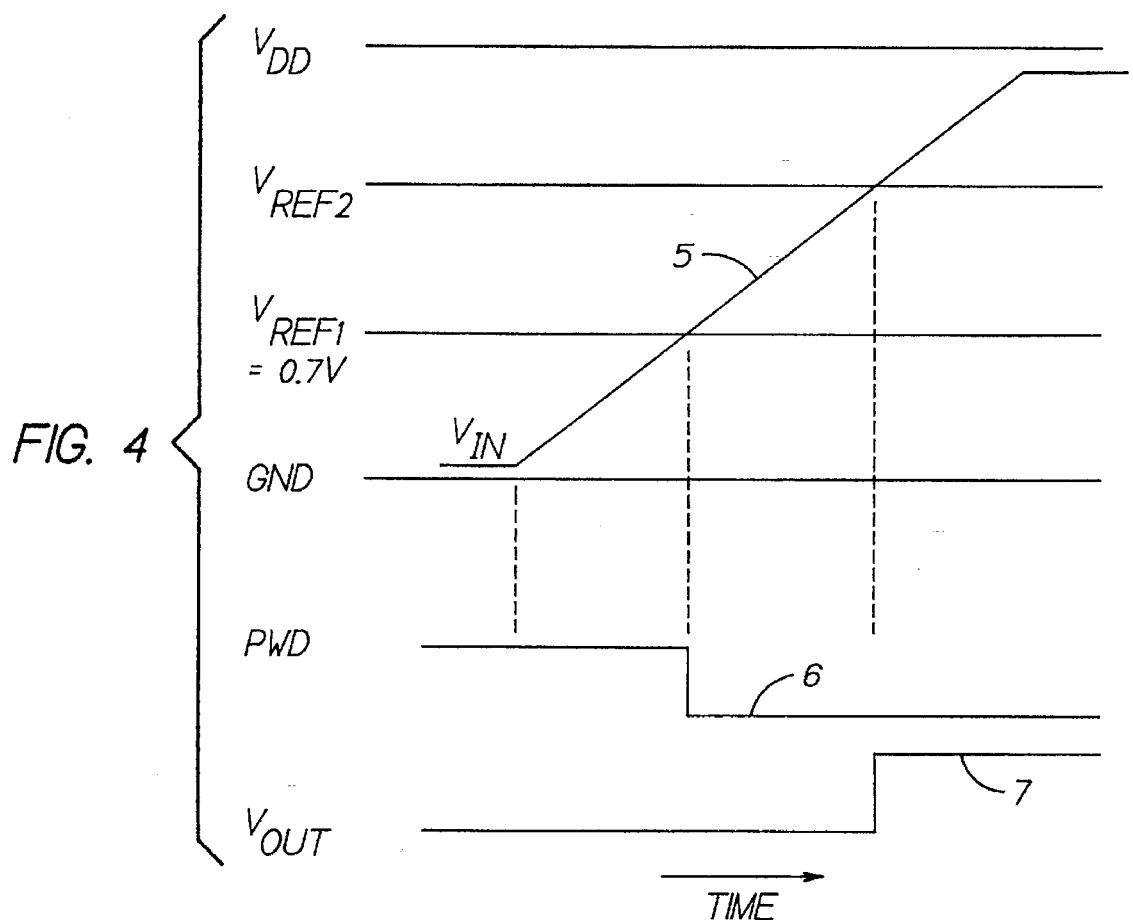
FIG. 4 shows signals of the detector shown in FIG. 3 as a function of the input signal voltage level.

FIG. 4 shows the signals of the inventive accurate detection method for an input signal as a function of the input signal voltage level. In the drawing, the input voltage VIN is represented by curve 5, the output voltage PWD of the switch 4 is represented by curve 6, and the output voltage VOUT is represented by curve 7. When the output voltage PWD (6) of the switch 4 is high, ie. practically on the level of the supply voltage VDD (not shown in FIG. 3), the comparator 1 is off. When the input voltage VIN exceeds the reference level VREF 1 of the switch 4, the output 6 of the switch 4 becomes almost zero, ie. the switch connects the output point comparison circuit to ground. Then the comparator 1 is connected to ground and it can take current from the operating voltage VDD. The comparator 1 switches the output voltage VOUT (7) on when the input voltage VIN (5) exceeds the reference voltage VREF2.

Figure 5:
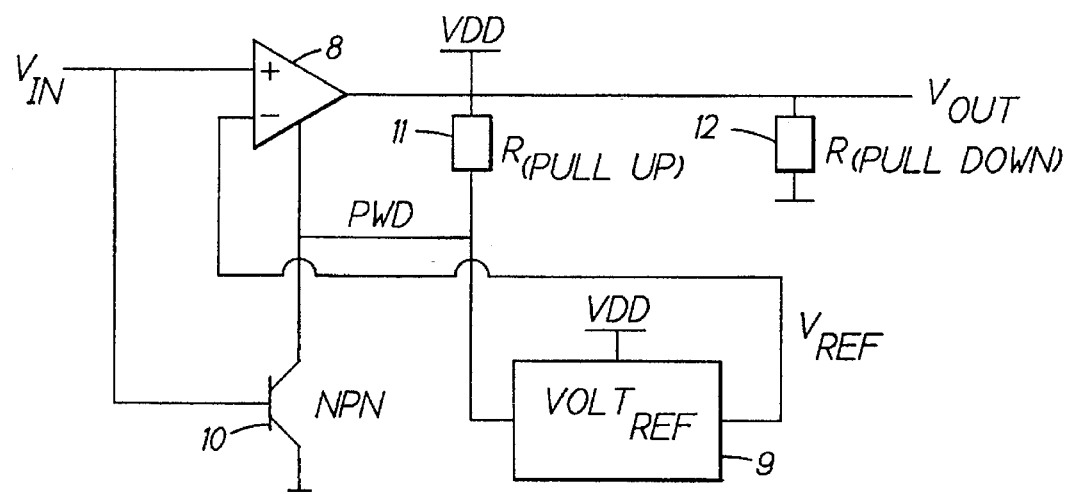
FIG. 5 shows the circuit diagram of the detector shown in FIG. 3.

FIG. 5 shows a circuit diagram of the inventive accurate detection method for an input signal of the comparison circuit. The comparison circuit comprises a comparator 8, a reference voltage generator 9 (VOLTREF), a transistor 10, a pull-up resistor 11 (Rpullup), and a pull-down resistor 12 (Rpulldown). The power to the circuit is supplied from the operating voltage VDD. The output signal VOUT of the circuit controls other logic units (not shown) of the mobile telephone. The transistor 10 is an NPN transistor and the threshold voltage is about 0.7 V. The switch may also be an n-channel FET, and then the threshold is, depending on the type, about 1 to 4 V. The comparator may be e.g. an operational amplifier.

When the input voltage VIN is smaller than the threshold voltage of the NPN transistor 10, ie. the voltage VREF1, the operating voltage VDD is brought to the collector of the transistor via the resistor 11. Then the comparator 8 and the reference voltage generator 9 are off and do not significantly consume current from the battery. The pull-down resistor 12 keeps the output signal VOUT to the logic control low, so no significant amount of current is consumed that way, either, and the control voltage VOUT is not indefinite.

When the input voltage VIN brought to the base of the NPN transistor 10 exceeds the threshold voltage VREF 1, the transistor 10 switches with the intermediate output signal PWD the comparator 8 and the reference voltage generator 9 on. It is known that the threshold voltage (VREF 1 ) of such a transistor, ie. the lowest base-emitter voltage for a conducting transistor, is about 0.7 V. The output signal PWD is now practically connected to ground through the transistor 10 and, thus, the generator and comparator are enabled. The comparator 8 compares the input signal VIN to the accurate reference voltage VREF2 generated by the reference voltage generator 9. If the input voltage VIN is smaller or if the the input voltage VIN becomes smaller than the reference voltage VREF2 produced by the reference voltage generator 9, the output voltage VOUT stays low. The comparator 8 switches the output voltage VOUT to the logic control on when the input voltage VIN exceeds the reference voltage VREF generated by the reference voltage generator 9.

With the inventive method it is possible to reduce the discharge current from the battery almost down to the level of the self-discharge current of the battery. Then the transistor 10 may be of a type that has very small leakage currents. It is also possible to dimension the electric circuit of the transistor 10 so that the current it takes from the voltage source VDD is very small, advantageously about 100 µA. or even less, when the input voltage VIN is smaller than the coarse reference voltage VREF 1. In practice, a neglible current ($\alpha$nA) flows through the transistor 10.

The inventive detection method can well be used in portable mobile telephone equipment. If a mobile telephone uses a battery of the type mentioned before with a capacity of 400 mAh, then, thanks to the inventive method, the discharge time of the battery is increased up to 167 days (400 mAh/100 µA=4,000 h=167 days), ie. almost six-fold compared to prior art methods.

The inventive detection method can well be used together with lithium batteries. The inventive method makes the use of lithium batteries easier since the discharge current drawn from the battery is so small that it will not damage the lithium battery.

A person skilled in the art will understand that the example presented above may be modified and changed and, on the other hand, corresponding alternative methods may be used that still fall within the scope of the invention defined by the claims set forth below.

As was mentioned earlier, the positive voltage logic used in this example could be replaced by a negative voltage logic circuit, in which case an NPN transistor, for example, should be replaced by a PNP transistor. It is also possible to choose such a PNP transistor that it meets the above-mentioned requirements, ie. it has small leakage currents and its threshold voltage is about the same as that of an NPN transistor.

The transistors 10, operational amplifiers 8 and the reference voltage generator 9 can be advantageously implemented as a specially designed ASIC circuit (Application Specific Integrated Circuit). Naturally, the resistors 11 and 12 may also be integrated in that same circuit.

I claim:

1. A method for detecting an input signal level exceeding a threshold value upon which a battery operated device is switched on for reducing power consumption during a low power mode of said battery operated device, comprising the steps of:

providing a first comparing element, said first comparing element having a signal input and a signal output;

providing a second comparing element, said second comparing element having a reference voltage input, a signal input, a signal output, and an enabling input, said reference voltage input of said second comparing element being electrically coupled to an accurate reference voltage;

providing an input signal to said signal input of said first comparing element wherein said first comparing element generates an intermediate output signal at said signal output of said first comparing element when said input signal exceeds a coarse reference voltage;

providing said intermediate output signal to said enabling input of said second comparing element wherein said intermediate output signal switches on said second comparing element;

providing said input signal to said signal input of said second comparing element wherein said second comparing element generates a detection signal at said signal output of said second comparing element when said input signal exceeds said accurate reference voltage, the absolute value of said accurate reference voltage being larger than the absolute value of said coarse reference voltage, said input signal transitions through a range of values between a value smaller than said coarse reference voltage and a value larger than said accurate reference voltage wherein at one time said first and second comparing elements are both disabled and at other times said first and second comparing elements are both enabled.

2. The method of claim 1, wherein the step of providing said intermediate output signal to said enabling input of said second comparing element further comprises the step of providing said intermediate output signal to an accurate reference voltage generator, said intermediate output signal electrically enabling said accurate reference voltage generator, said accurate reference voltage generator providing said accurate reference voltage to said second comparing element.

3. A comparison circuit for detecting a voltage potential exceeding a threshold value, the voltage potential powering a battery operated device, comprising:

a first comparing element having a signal input coupled to the voltage potential and a signal output, said first comparing element transitioning said signal output when said voltage potential exceeds a predetermined value;

a second comparing element having a reference voltage input, an enabling input, a signal input coupled to the voltage potential and a signal output, said reference voltage input of said second comparing element being electrically coupled to an accurate reference voltage, said enabling input of said second comparing element being electrically coupled to said signal output of said first comparing element wherein said second comparing element is electrically enabled by said signal output of said first comparing element, said signal output of said second comparing element defining a detection signal that is coupled to an enabling input of said battery operated device, wherein said detection signal at said signal output of said second comparing element is responsive to said voltage potential exceeding said accurate reference voltage for enabling said battery operated device, wherein when said voltage potential is less than said predetermined value said first and second comparing elements are both disabled, and when said voltage potential is greater than said predetermined value said first and second comparing elements are both enabled.

4. The comparison circuit of claim 3 wherein said first comparing element is comprised of a transistor, and said predetermined value is a threshold voltage of said transistor.

5. The comparison circuit of claim 4, wherein said transistor is an n-channel FET with a threshold voltage of about 1 V to about 4 V.

6. The comparison circuit of claim 4, wherein said transistor is a low power device, consuming about 100 A when the voltage of said input signal is smaller than said threshold voltage of said transistor.

7. The comparison circuit of claim 3, wherein said second comparing element is an operational amplifier.

8. The comparison circuit of claim 3, further comprising an accurate reference voltage generator having at least an enabling input and a signal output, said enabling input electrically coupled to said signal output of said first comparing element wherein said accurate reference voltage generator is enabled by said signal output of said first comparing element, said signal output of said accurate reference voltage generator being said accurate reference voltage.

9. The comparison circuit of claim 3, wherein the power source of said battery operated device is a lithium battery.

10. The comparison circuit of claim 3 wherein said comparison circuit is incorporated into a portable, hand-held radio device.

11. The comparison circuit of claim 4, wherein said transistor is an NPN transistor with a threshold voltage of about 0.7 V.

12. The comparison circuit of claim 8, wherein said comparing elements and said accurate reference voltage generator are implemented as an ASIC circuit.

13. The comparison circuit of claim 3 wherein said first comparing element further comprises a reference voltage input electrically coupled to a coarse reference voltage.

14. The comparison circuit of claim 10 wherein said radio device is comprised of a cellular telephone.

15. A comparison circuit for detecting an input signal level exceeding a threshold value upon which a battery operated device is switched on, thereby reducing power consumption during low power modes of said battery operated device, comprising:

a voltage switch having a signal input, a reference voltage input, and a signal output, said signal input of said voltage switch being electrically coupled to an input signal, said reference voltage input of said voltage switch being electrically coupled to a coarse reference voltage, said signal output of said voltage switch being responsive to said input signal which exceeds said coarse reference voltage; and a voltage comparator having a signal input, a reference voltage input, a signal output, and an enabling input, said signal input of said voltage comparator being electrically coupled to said input signal, said reference voltage input of said voltage comparator being electrically coupled to an accurate reference voltage, said signal output of said voltage comparator being responsive to said input signal which exceeds said accurate reference voltage, said enabling input of said voltage comparator being electrically coupled to said signal output of said voltage switch wherein said voltage comparator is switched on when said input signal exceeds said coarse reference voltage, the absolute value of said accurate reference voltage being larger than the absolute value of said coarse reference voltage, said input signal transitioning from a value smaller than said coarse reference voltage to a value larger than said accurate voltage wherein at one time said voltage switch and said voltage comparator are both disabled and at other times said voltage switch and said voltage comparator are both enabled.

* * * * *